(12) United States Patent
Kim

(10) Patent No.: US 9,940,979 B2
(45) Date of Patent: Apr. 10, 2018

(54) SEMICONDUCTOR DEVICE INCLUDING A REDISTRIBUTION LAYER

(71) Applicant: SK hynix Inc., Icheon-si, Gyeonggi-do (KR)

(72) Inventor: Tae Kyun Kim, Icheon-si, Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 226 days.

(21) Appl. No.: 14/731,943

(22) Filed: Jun. 5, 2015

(65) Prior Publication Data
US 2016/0284384 A1    Sep. 29, 2016

(30) Foreign Application Priority Data
Mar. 27, 2015    (KR) .................. 10-2015-0043257

(51) Int. Cl.
| H03K 3/00 | (2006.01) |
| G11C 7/10 | (2006.01) |
| G11C 8/08 | (2006.01) |
| G11C 5/06 | (2006.01) |
| H01L 25/065 | (2006.01) |
| H01L 23/48 | (2006.01) |

(52) U.S. Cl.
CPC ............... *G11C 7/10* (2013.01); *G11C 5/063* (2013.01); *G11C 8/08* (2013.01); *G11C 2207/105* (2013.01); *G11C 2207/108* (2013.01); *H01L 23/481* (2013.01); *H01L 25/0657* (2013.01); *H01L 2225/06541* (2013.01)

(58) Field of Classification Search
CPC ......... G11C 7/10; G11C 7/12; H01L 25/0657; H01L 23/50; H01L 23/481; H01L 23/5286; H01L 2225/06541
USPC ........................................................ 327/109
See application file for complete search history.

(56) References Cited

U.S. PATENT DOCUMENTS

| 7,450,437 B2 * | 11/2008 | Choi ................... G11C 7/1051 326/27 |
| 8,405,424 B2 * | 3/2013 | Bennett ............ H03K 19/01857 326/27 |
| 2009/0039915 A1 * | 2/2009 | Ruckerbauer ............ G11C 5/02 326/38 |
| 2012/0193815 A1 | 8/2012 | Chou et al. |

* cited by examiner

*Primary Examiner* — Patrick Chen
(74) *Attorney, Agent, or Firm* — William Park & Associates Ltd.

(57) ABSTRACT

A semiconductor device may include a first redistribution layer configured to allow for input and output of a first signal through the first redistribution layer. The semiconductor device may include a second redistribution layer configured to allow for input and output of a second signal through the second redistribution layer. The semiconductor device may include a first input/output (I/O) unit configured to input and output the first signal or the second signal through the first I/O unit. The semiconductor device may include a first selection unit configured to selectively couple a connection among the first redistribution layer, the second redistribution layer, and the first I/O unit in response to a logic level of a first selection signal. The semiconductor device may include a first selection signal generation unit configured to generate the first selection signal.

19 Claims, 12 Drawing Sheets

SEMICONDUCTOR DEVICE INCLUDING A REDISTRIBUTION LAYER

CROSS-REFERENCE TO RELATED APPLICATION

This application claims priority based upon Korean patent application No. 10-2015-0043257, filed on Mar. 27, 2015, the disclosure of which is hereby incorporated in its entirety by reference herein.

BACKGROUND

1. Technical Field

Various embodiments may generally relate to a semiconductor device, and more particularly, to a technology for a 3DS (3 Dimensional Stacked) memory including a RDL (ReDistribution Layer).

2. Related Art

To increase the integration degree of a semiconductor device, a 3DS semiconductor device has been developed. The 3DS semiconductor device includes a plurality of chips, stacked, in a single package. The stacked chips are also packaged to increase the integration degree of the 3DS semiconductor device. The 3DS semiconductor device includes a plurality of chips. The 3DS semiconductor device identifies each chip using an electrical signal so that a specific chip can be selected.

A plurality of chips configured to construct a general semiconductor device may be obliquely stacked. Each chip may include a separate chip selection pin for receiving a chip selection signal. Each chip may receive two voltages (VDD, VSS) through the chip selection pin. Therefore, one of the chips may be selected according to the voltages (VDD, VSS) received through the chip selection pin.

For example, assuming that a conventional semiconductor device has two chip selection pins, it may be possible to select a maximum of 4 chips. However, the conventional semiconductor device must have a separate chip selection pin as described above, so that it becomes difficult to guarantee the chip area and a limited number of chips must be selected. In addition, the conventional semiconductor device must have a wire for coupling a voltage input terminal to a chip selection pin, so that lines become complicated. Furthermore, respective chips must be obliquely stacked. Packaging becomes complicated and difficulty in such packaging increases when chips must be obliquely stacked.

Recently, 3DS semiconductor devices using TSV (Through Silicon Via) have been developed. The semiconductor devices including a plurality of chips may electrically interconnected the plurality of chips through TSV.

TSV-based semiconductor devices may be formed by stacking the same type of chips or different types of chips. Generally, one semiconductor device may be formed by stacking a plurality of slave chips having the same structure as in at least one master chip. The master chip may have the same type of a slave chip or may be a heterogeneous chip having a different type of a slave chip.

The master chip and a plurality of slave chips may be electrically interconnected through a TSV. The plurality of slave chips may allow a receiver to commonly receive data transmitted from a master chip through a TSV. Signals transmitted from each slave chip through a transceiver may also be commonly received by the master chip through TSV.

For example, if a signal is transmitted through TSV, all the slave chips commonly receive the signal allowing all of the slave chips to operate. Therefore, a method for selecting an actually-operating slave chip is needed if a signal is transmitted through TSV, all the slave chips commonly receive the signal allowing all of the slave chips to operate. A slave chip to be operated is discriminated. Thus, although all the slave chips commonly receive a signal from the master chip, only a slave chip to be actually operated can operate upon receiving the signal.

However, if RDL (ReDistribution Layer)-based memories are stacked for IO (Input/Output) extension, a redistribution layer (RDL) used as a rearrangement layer may collide, overlap, or intersect with a TSV line for the IO extension.

SUMMARY

According to an embodiment, there may be provided a semiconductor device. The semiconductor device may include a first redistribution layer configured to allow for input and output of a first signal through the first redistribution layer. The semiconductor device may include a second redistribution layer configured to allow for input and output of a second signal through the second redistribution layer. The semiconductor device may include a first input/output (I/O) unit configured to input and output the first signal or the second signal through the first I/O unit. The semiconductor device may include a first selection unit configured to selectively couple a connection among the first redistribution layer, the second redistribution layer, and the first I/O unit in response to a logic level of a first selection signal. The semiconductor device may include a first selection signal generation unit configured to generate the first selection signal.

DETAILED DESCRIPTION

Reference will now be made to various embodiments, examples of some embodiments are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Various embodiments of the present disclosure may be directed to providing a semiconductor device that substantially obviates one or more problems due to limitations and disadvantages of the related art.

The embodiments of the present disclosure may relate to a technology for controlling a pad connection path through a control signal in a 3DS memory having a RDL, and preventing a pad line for a rearrangement layer from colliding, overlapping, or intersecting with a TSV line.

FIGS. 1 to 4 illustrate representations of examples of the connection relationship between a pad line layer for a rearrangement layer and a TSV line layer. FIGS. 1 to 4 illustrate that a redistribution layer (RDL) and a mask for 3DS are separated from each other and the separated RDL and the mask are applied.

Figure 1:
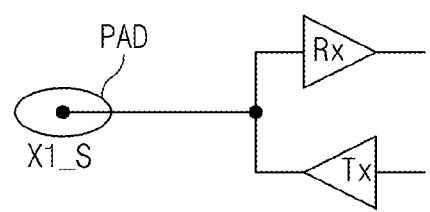
FIGS. 1 to 4 illustrate representations of examples of the connection relationship between a pad line layer for a rearrangement layer and a TSV line layer.
Figure 2:
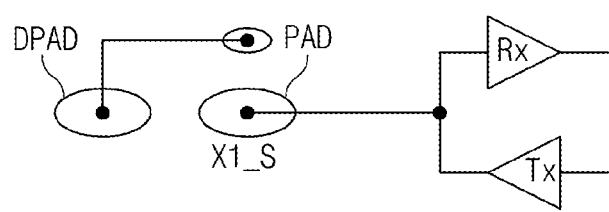

Referring to FIG. 1, a signal (X1_S) received through a transceiver TX may be applied to a pad (PAD). A signal (X1_S) generated from the pad (PAD) may be output to the inside of, for example, a dynamic random access memory (DRAM) through a receiver (RX). In this example, the signal (X1_S) may indicate the number of input/output (I/O) ports of a single chip package. A dummy pad (DPAD) for interconnecting chips through a TSV may be provided in consideration of the example of stacking a plurality of chips. For example, referring to FIG. 2, a dummy pad (DPAD) for interconnecting chips through a TSV may be provided in consideration of the example of stacking a plurality of chips. FIG. 2, for example, illustrates a signal (X1_S) received through a transceiver TX may be applied to a pad (PAD). A signal (X1_S) generated from the pad (PAD) may be output to the inside of, for example, a DRAM through a receiver (RX). In this example, the signal (X1_S) may indicate the number of input/output (I/O) ports of a single chip package.

A packaging technology of an integrated circuit (IC) may be developed to satisfy the demand for miniaturization and mounting reliability. For example, miniaturization may be accelerating the development of a technology related to a package close to a chip size. The demand of mounting reliability is emphasizing importance of a packaging technology capable of enhancing the efficiency of a mounting task and mechanical/electrical reliability after the mounting task.

Various technologies for providing high-capacity semiconductor modules may be developed to meet the demand for high performance in addition to the demand for miniaturization of electric/electronic products. A method for highly integrating a memory chip may be used to provide a high-capacity semiconductor module. Such highly-integrating technology may be implemented by inserting many more cells into a limited space of a semiconductor chip.

However, technology for highly integrating a memory chip requires a precise critical dimension (CD), and also requires advanced technologies and a long period of development time. Therefore, stack technology may be proposed as another method for providing high-capacity semiconductor modules.

Stack technologies may be classified into a method for embedding 2 stacked chips into one package and a method for stacking 2 product packages. However, the method for stacking 2 product packages may have a limitation in height of a semiconductor package according to miniaturization trends of electric/electronic products.

Therefore, stack packaging and multi-chip packaging technology may be used for inserting 2~3 semiconductor chips into one package.

In this example, the multi-chip packaging technology may be classified into one packaging method for packaging several semiconductor chips by enumerating the semiconductor chips on a semiconductor substrate and the other packaging method for stacking two or more semiconductor chips and packaging the stacked semiconductor chips. For example, the method for stacking two or more semiconductor chips may implement a TSV (Through Silicon Via)-based structure.

A TSV-based package may form a hole passing through a semiconductor chip in a semiconductor chip, may form a TSV by filling this hole with a conductive material, and may be implemented by interconnecting an upper semiconductor chip and a lower semiconductor chip through the medium of a TSV. Electrical connection of stack packaging technology may be achieved by TSV, so that electrical deterioration may be prevented, the operation speed of a semiconductor chip may greatly increase, and miniaturization of the semiconductor chip may be implemented.

Figure 3:
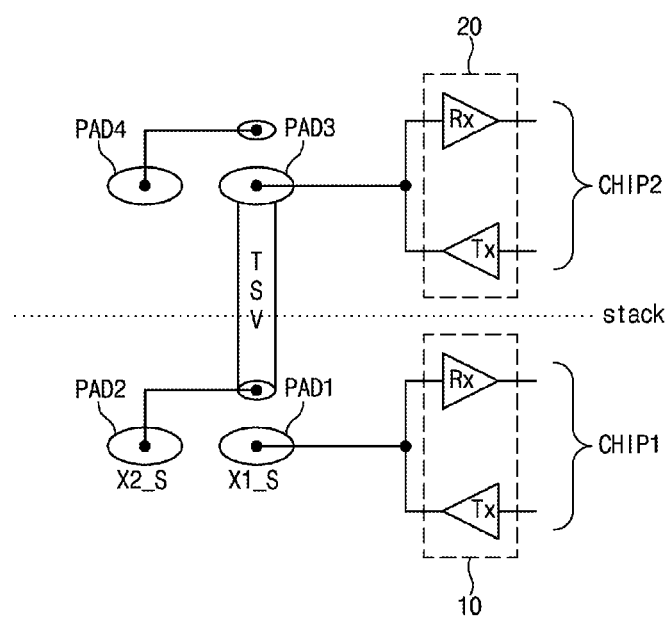

FIG. 3 illustrates a structure for coupling a lower chip CHIP1 to an upper chip CHIP2 using a TSV. The lower chip CHIP1 may include pads (PAD1, PAD2) and may transmit/receive signals to/from an input/output (I/O) unit 10. The upper chip CHIP2 may include pads (PAD3, PAD4) and may transmit/receive signals to/from the I/O unit 20. In this example, if the lower chip CHIP1 and the upper chip CHIP2 are stacked, the pad PAD2 of the lower chip CHIP1 may be coupled to the pad PAD3 of the upper chip CHIP2 through a TSV.

For example, for IO extension of a memory to which a redistribution layer RDL1 is not applied, lines may be implemented in order of FIGS. 1, 2, and 3 so that chips can be stacked. If chips are stacked in the order of FIGS. 1 to 3, individual chips need to be interconnected through a TSV so that it may be possible to use the same mask.

Referring to an embodiment of FIG. 3, when a system transmits a signal and a memory (e.g., DRAM) receives the signal, an input signal (X1_S) may be transmitted to a receiver RX through a pad PAD3 For example, when the memory transmits a signal and the system receives the signal, a signal generated through a transceiver TX are output, as a signal (X1_S), to the system through the pad PAD3.

Although an embodiment has described the receiver RX for receiving a signal and the transceiver TX for transmitting a signal from the viewpoint of a memory, it should be noted that the receiver RX and the transceiver TX may have opposite directions from the viewpoint of a system.

Figure 4:
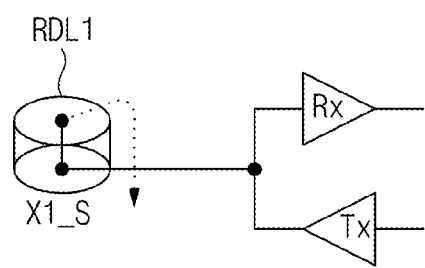

Referring to FIG. 4, the signal (X1_S) may be applied through a redistribution layer RDL1 used as a rearrangement layer. The signal (X1_S) received through the transceiver TX may be applied to the redistribution layer RDL1. The signal (X1_S) generated from the redistribution layer RDL1 may be output to the inside of, for example a DRAM, through the receiver RX.

Assuming that an upper semiconductor chip is simply coupled to a lower semiconductor chip according to multi-chip packaging technology, it is impossible for the multi-chip packaging technology to implement a correct memory operation using a high-density structure. Because of this problem, when individual semiconductor chips are stacked, an upper semiconductor chip and a lower semiconductor chip can be distinguished from each other according to different signals allocated to respective semiconductor chips.

For this purpose, each redistribution layer RDL1 may formed over each semiconductor chip, the redistribution layer RDL1 may be coupled not only to a TSV formed over each semiconductor chip but also to an electrode terminal suitable for the TSV, resulting in a distinction for each semiconductor chip.

However, a memory to which the redistribution layer RDL1 is applied may require a pad line layer for connecting the redistribution layer RDL1. Therefore, a pad line layer for a redistribution layer RDL1 may collide, overlap, or intersect with a TSV line layer for IO extension. In the example of implementing a stacked chip in the order of FIG. 4→FIG. 2→FIG. 3 to stack memories to which the redistribution layer RDL1 is applied, it may be necessary to change a mask to another mask.

A 3DS semiconductor chip including a redistribution layer RDL1 must perform the patterning processes of the redistribution layer RDL1 and a TSV in different ways in consideration of the stacking of semiconductor chips. Accordingly, a mask for patterning must be separately formed, resulting in the occurrence of high costs. Furthermore, the patterning process must be performed by changing the position of a mask according to a stack position of semiconductor chips, so that productivity is deteriorated and production costs increase.

FIGS. 5 to 8 are circuit diagrams illustrating representations of examples of a semiconductor device according to an embodiment. The embodiments of FIGS. 5 to 8 illustrate a semiconductor device to which a redistribution layer and a 3DS mask may be equally applied.

Figure 5:
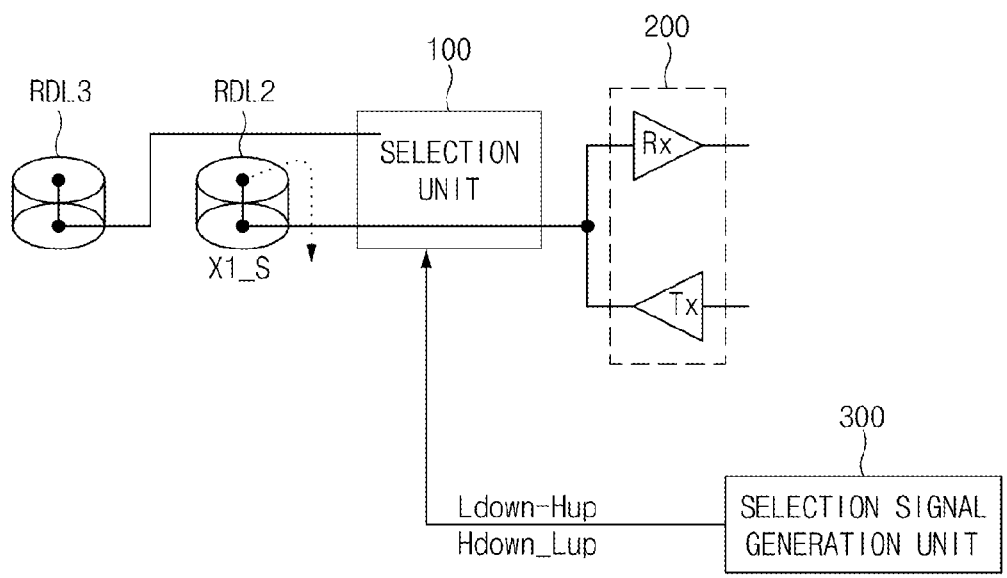
FIGS. 5 to 8 are circuit diagrams illustrating representations of examples of a semiconductor device according to an embodiment.

FIG. 5 is a conceptual diagram illustrating a representation of an example of a die in which a redistribution layer and a 3DS package are considered. The semiconductor device illustrated in FIG. 5 may include redistribution layers (RDL2, RDL3), a selection unit 100, an input/output (I/O) unit 200, and a selection signal generation unit 300.

In an example, the redistribution layer RDL3 may be used as a dummy line for 3DS connection, and may receive a signal (X1_S) through the redistribution layer RDL2. The selection unit 100 may select a redistribution layer RDL2 or RDL3 in response to a selection signal (Ldowrn_Hup or Hdown_Lup), and may connect the selected redistribution layer RDL (i.e., RDL2 and/or RDL3) to the I/O unit 200. For example, an embodiment of FIG. 5 may allow the selection unit 100 to control connection between the I/O unit 200 to input/output (I/O) nodes.

For example, if a redistribution layer RDL2 is selected by the selection unit 100, the signal (X1_S) of the redistribution layer RDL2 is input and output through the I/O unit 200. For example, if a redistribution layer RDL3 serving as a dummy line is selected by the selection unit 100, signals of the redistribution layer RDL3 are input and output through the I/O unit 200.

The I/O unit 200 may include a receiver RX and a transceiver TX. The signal received through the transceiver TX may be applied to the redistribution layer RDL2 or RDL3. The signal generated from RDL2 or RDL3 may be output to the inside of, for example, a DRAM through the receiver RX. The embodiment has disclosed, for example, that the receiver RX and the transceiver TX are located in a DRAM.

The selection signal generation unit 300 may generate a selection signal (Ldowrn_Hup or Hdown_Lup) and output the generated selection signal to the selection unit 100. For example, if the selection signal Ldowrn_Hup of a low level is applied, a connection terminal of the redistribution layer RDL2 serving as a lower line is selected. For example, if the selection signal Ldowrn_Hup of a high level is applied, a connection terminal of the redistribution layer RDL3 serving an upper line is selected.

The scope or spirit of the embodiments are not limited thereto. If the selection signal generation unit 300 generates the selection signal (Hdown_Lup), an opposite path may be selected according to a logic level of the selection signal (Hdown_Lup).

Figure 6:
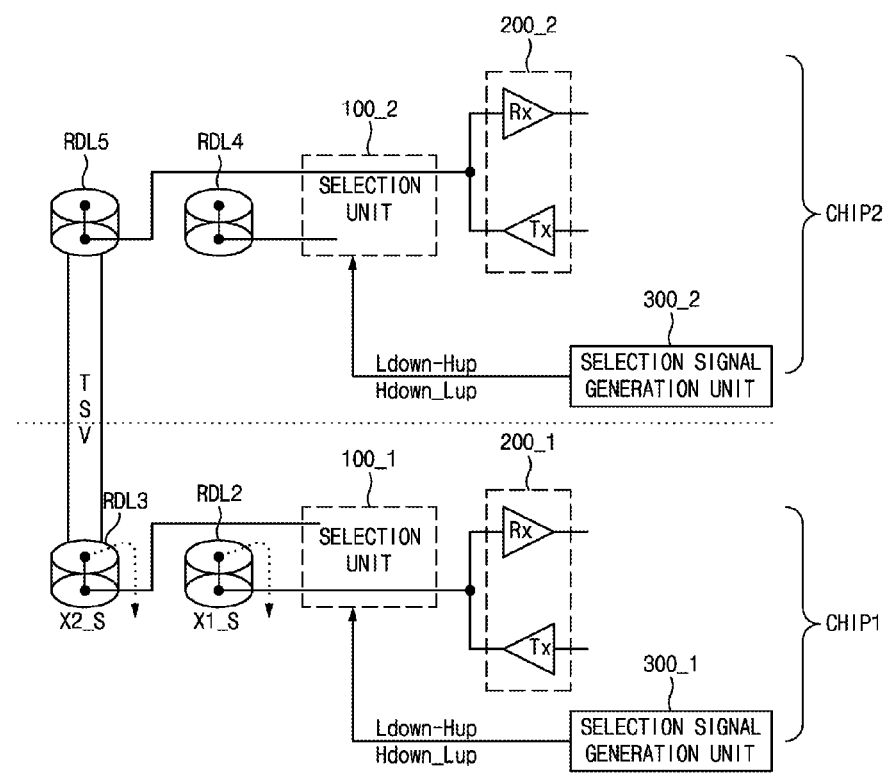

An embodiment of FIG. 6 illustrates a 3DS structure including a lower chip CHIP1 and an upper chip CHIP2 coupled to each other through a TSV by stacking the lower chip CHIP1 and the upper chip CHIP2.

An embodiment of FIG. 6 may include redistribution layers (RDL2~RDL5), selection units (100_1, 100_2), input units (200_1, 200_2), and selection signal generation units (300_1, 300_2).

In an example, the lower chip CHIP1 may include redistribution layers (RDL2, RDL3), a selection unit (100_1), an I/O unit (200_1), and a selection signal generation unit (300_1). The upper chip CHIP2 may include redistribution layers (RDL4, RDL5), a selection unit (100_2), an I/O unit (200_2), and a selection signal generation unit (300_2).

If the redistribution layer RDL2 of the lower chip CHIP1 is coupled to the redistribution layer RDL4 of the upper chip CHIP2 through a TSV, the TSV line may collide, overlap, or intersect with the redistribution layers (RDL2, RDL4). Therefore, according to an embodiment, RDL2 is not coupled to RDL4, RDL3 of the lower chip CHIP1 is coupled to RDL5 of the upper chip CHIP2 through a TSV.

A signal (X1_S) may be applied through RDL2, and a signal (X2_S) may be applied through RDL3. The redistribution layer RDL3 serving as a dummy pad may be used as an I/O pad for extension. In an example, the signal (X2_S) may indicate the number of I/O ports increased when an IO is extended through 3DS. That is, an IO extension may indicate the extension of a bandwidth and density.

The selection unit (100_1) may select the redistribution layer RDL2 or RDL3 in response to the selection signal (Ldowrn_Hup or Hdown_Lup), and connect the selected RDL to the I/O unit (200_1). For example, if the redistribution layer RDL2 is selected by the selection unit (100_1), the signal (X1_S) of the redistribution layer RDL2 is input and output through the I/O unit (200_1). For example, if the redistribution layer RDL3 is selected by the selection unit (100_1), the signal of the redistribution layer RDL3 is input and output through the I/O unit (200_1). That is, an embodiment of FIG. 6 illustrates that the selection units (100_1, 100_2) control connection between the I/O units (200_1, 200_2) and the I/O nodes.

The I/O unit (200_1) may include a receiver RX and a transceiver TX. The signal received through the transceiver TX may be applied to the redistribution layer RDL2 or RDL3. Alternatively, the signal generated from the redistribution layer RDL2 or RDL3 may be output to the inside of, for example, a DRAM through the receiver RX.

The selection signal generator (300_1) may generate the selection signal (Ldowrn_Hup or Hdown_Lup), and output the generated selection signal to the selection unit (100_1). For example, if the selection signal (Ldowrn_Hup) of a low level is applied, a connection terminal of the redistribution layer RDL2 serving as a lower line is selected. For example, if the selection signal (Ldowrn_Hup) of a high level is applied, a connection terminal of the redistribution layer RDL3 serving as an upper line is selected.

The scope or spirit of the embodiments are not limited thereto. If the selection signal generator (300_1) generates a selection signal (Hdown_Lup), an opposite path may be selected according to a logic level of the selection signal (Hdown_Lup).

The selection unit (100_2) may select the redistribution layer RDL4 or RDL5 in response to the selection signal (Ldowrn_Hup or Hdown_Lup), and couple the selected RDL to the I/O unit (200_2). For example, if the redistribution layer RDL4 is selected by the selection unit (100_2), the signal of the redistribution layer RDL4 is input and output through the I/O unit (200_2). For example, if the redistribution layer RDL5 serving as a dummy line is selected by the selection unit (100_2), the signal of the redistribution layer RDL5 is input and output through the I/O unit (200_2).

The I/O unit (200_2) may include a receiver RX and a transceiver TX. The signal received through the transceiver TX is applied to the redistribution layer RDL4 or RDL5. Alternatively, the signal generated from the redistribution layer RDL4 or RDL5 may be output to the inside of a DRAM through the receiver RX.

The selection signal generator (300_2) may generate a selection signal (Ldowrn_Hup or Hdown_Lup), and output the generated selection signal to the selection unit (100_2). For example, if the selection signal (Ldowrn_Hup) of a low level is applied, a connection terminal of the redistribution layer RDL4 serving as a lower line is selected. For example, if the selection signal (Ldowrn_Hup) of a high level is applied, a connection terminal of the redistribution layer RDL5 serving as an upper line is selected.

The scope or spirit of the embodiments are not limited thereto. If the selection signal generation unit (300_2) generates a selection signal (Hdown_Lup), an opposite path may be selected according to a logic level of the selection signal (Hdown_Lup).

An embodiment of FIG. 6 selects the redistribution layer RDL2 serving as a lower line, and inputs/outputs signals to/from the I/O unit (300_1). In this example, the selection unit (100_2) selects the redistribution layer RDL5 serving as an upper line, and inputs/outputs signals to/from the I/O unit (300_2). For example, the redistribution layer RDL5 of the upper chip CHIP2 may be coupled to the redistribution layer RDL3 of the lower chip CHIP1 through a TSV.

As described above, the embodiments stack the lower chip CHIP1 and the upper chip CHIP2 and select a line path through the selection unit, so that upper and lower pads located at the same pad position do not collide, overlap, or intersect with each other, resulting in increased capacity (density) of a chip.

Figure 7:
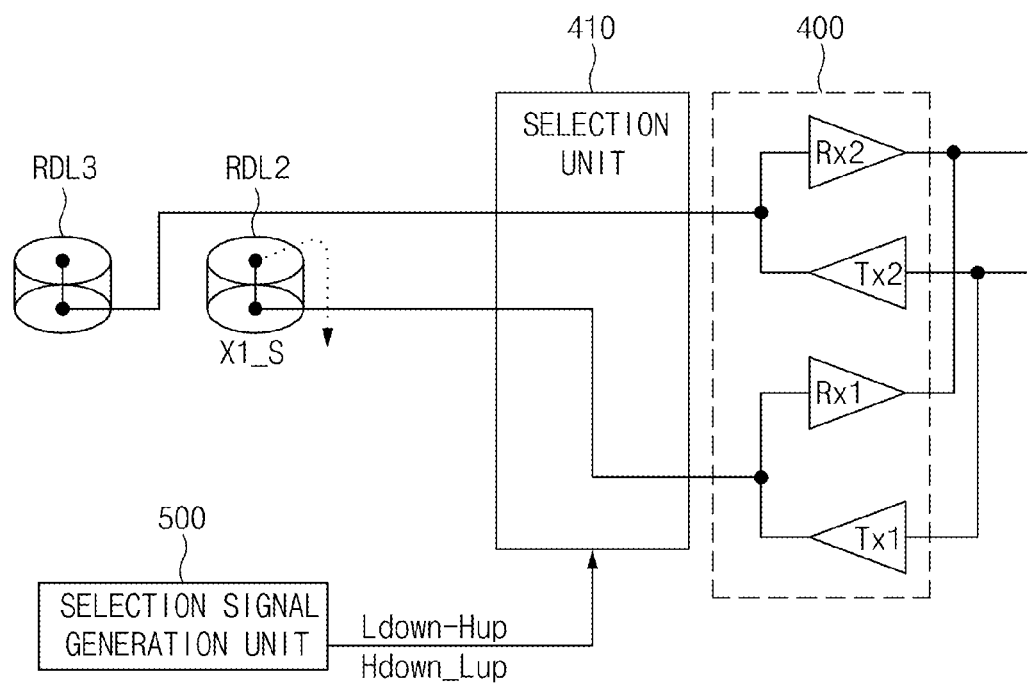

An embodiment of FIG. 7 may include redistribution layers (RDL2, RDL3), the I/O unit 400, the selection unit 410, and the selection signal generation unit 500.

In an example, the redistribution layer RDL3 may be used as a dummy line, and the signal (X1_S) may be applied through the redistribution layer RDL2. The I/O unit 400 may include receivers (RX1, RX2) and transceivers (TX1, TX2).

The selection unit 410 may selectively control connection among the redistribution layers (RDL2, RDL3), the receivers (RX1, RX2), and the transceivers (TX1, TX2) in response to the selection signal (Ldowrn_Hup or Hdown_Lup). For example, an embodiment of FIG. 7 allows the selection unit 410 to selectively control a pair of a lower transceiver and a lower receiver (RX1, TX1) or a pair of an upper transceiver and an upper receiver (RX2, TX2).

For example, if the redistribution layer RDL2 is selected by the selection unit 410, the signal (X1_S) of the redistribution layer RDL2 is input and output through the lower receiver RX1 and the transceiver TX1. For example, if the redistribution layer RDL3 is selected by the selection unit 410, the signal of the redistribution layer RDL3 is input and output through the upper receiver RX2 and the upper transceiver TX2. The signal of the redistribution layer RDL3 is input and output through the upper receiver RX2 and the upper transceiver TX2. Therefore, the I/O unit 400 receives a signal through the transceiver TX1 or TX2, and output a signal to the inside of DRAM through the receiver RX1 or RX2.

The selection signal generation unit 500 may generate a selection signal (Ldowrn_Hup or Hdown_Lup), and output the generated selection signal to the selection unit 410. For example, if the selection signal (Ldowrn_Hup) of a low level is applied, the redistribution layer RDL2 serving as a lower line is coupled to the transceiver TX1 and the receiver RX1. For example, if the selection signal (Ldowrn_Hup) of a high level is applied, the redistribution layer RDL3 serving as an upper line is coupled to the transceiver TX2 and the receiver RX2.

The scope or spirit of the embodiments are not limited thereto. If the selection signal generation unit 500 generates the selection signal (Hdown_Lup), an opposite path may be selected according to a logic level of the selection signal (Hdown_Lup).

Figure 8:
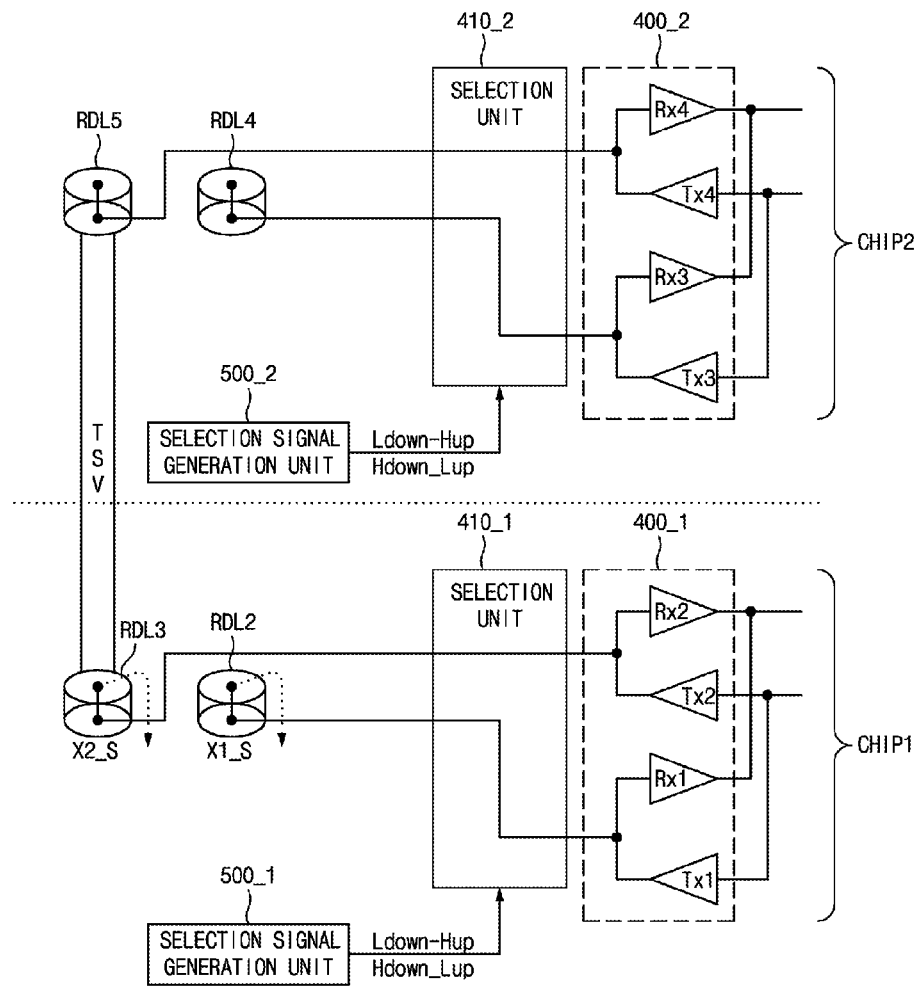

An embodiment of FIG. 8 illustrates a lower chip CHIP1 coupled to an upper chip CHIP2 through a TSV by stacking the lower chip CHIP1 and the upper chip CHIP2.

An embodiment of FIG. 8 may include redistribution layers (RDL2~RDL5), input units (400_1, 400_2), selection units (410_1, 410_2), and selection signal generation units (500_1, 500_2).

If the redistribution layer RDL2 of the lower chip CHIP1 is coupled to the redistribution layer RDL4 of the upper chip CHIP2 through a TSV, the TSV line may collide, overlap, or intersect with the redistribution layers (RDL2, RDL4). Therefore, an embodiment may illustrate that the redistribution layer RDL2 is not coupled to the redistribution layer RDL4 and the redistribution layer RDL3 is coupled to the redistribution layer RDL5 through a TSV.

The signal (X2_S) may be received through the redistribution layer RDL3, and the signal (X1_S) may be received through the redistribution layer RDL2. The input unit (400_1) may include receivers (RX1, RX2) and transceivers (TX1, TX2).

The selection unit (410_1) may selectively control connection among the redistribution layers (RDL2, RDL3), the receivers (RX1, RX2), and the transceivers (TX1, TX2) in response to the selection signal (Ldowrn_Hup or Hdown_Lup). For example, an embodiment of FIG. 8 allows the selection unit (410_1) to selectively control a pair of a lower transceiver and a lower receiver (TX1, RX1) or a pair of an upper transceiver and an upper receiver (TX2, RX2) of the I/O unit (400_1).

For example, if the redistribution layer RDL2 is selected by the selection unit (410_1), the signal (X1_S) of the redistribution layer RDL2 is input and output through the lower receiver RX1 and the lower transceiver TX1. For example, if the redistribution layer RDL3 is selected by the selection unit (410_1), a signal of the redistribution layer RDL3 is input and output through the upper receiver RX2 and the upper transceiver TX2. Therefore, the I/O unit (400_1) may receive signals through the transceiver TX1 or TX2, and may output signals to the inside of, for example, a DRAM through the receiver RX1 or RX2.

The selection signal generation unit (500_1) may generate a selection signal (Ldowrn_Hup or Hdown_Lup), and output the generated selection signal to the selection unit (410_1). For example, if the selection signal (Ldowrn_Hup) of a low level is applied, the redistribution layer RDL2 serving as a lower line is coupled to the transceiver TX1 and the receiver RX1. For example, if the selection signal (Ldowrn_Hup) of a high level is applied, the redistribution layer RDL3 serving as an upper line is coupled to the transceiver TX2 and the receiver RX2.

The I/O unit (400_2) may include a selection unit (410_2), receivers (RX3, RX4), and transceivers (TX3, TX4).

The selection unit (410_2) may selectively control connection among the redistribution layers (RDL4, RDL5), the receivers (RX3, RX4), and the transceivers (TX3, TX4) in response to the selection signal (Ldowrn_Hup or Hdown_Lup). For example, an embodiment of FIG. 8 allows the selection unit (410_2) to selectively control a pair of a lower transceiver and a lower receiver (TX3, RX3) or a pair of an upper transceiver and an upper receiver (TX4, RX4) of the I/O unit (400_2).

For example, if the redistribution layer RDL4 is selected by the selection unit (410_2), the signal of the redistribution layer RDL4 is input and output through a lower receiver RX3 and a lower transceiver TX3. For example, if the redistribution layer RDL5 is selected by the selection unit (410_2), the signal of the redistribution layer RDL5 is input and output through the upper receiver RX4 and the upper transceiver TX4. Therefore, the I/O unit (400_2) may receive signals through the transceiver TX3 or TX4, and output signals to the inside of DRAM through the receiver RX3 or RX4.

The selection signal generation unit (500_2) may generate a selection signal (Ldowrn_Hup or Hdown_Lup), and output the generated selection signal to the selection unit (410_2). For example, if the selection signal (Ldowrn_Hup) of a low level is applied, the redistribution layer RDL4 serving as a lower line is coupled to the transceiver TX3 and the receiver RX3. For example, if the selection signal (Ldowrn_Hup) of a high level is applied, the redistribution layer RDL5 serving as an upper line is coupled to the transceiver TX4 and the receiver RX4.

The scope or spirit of the embodiments are not limited thereto. If the selection signal generation units (500_1, 500_2) generate a selection signal (Hdown_Lup), an opposite path may be selected according to a logic level of the selection signal (Hdown_Lup).

An embodiment of FIG. 8 may allow the selection unit (410_1) to select the redistribution layer RDL2 serving as a lower line so that signals are input and output through the receiver RX1 and the transceiver TX1. In an example, the selection unit (410_2) selects the redistribution layer RDL5 serving as an upper line so that signals are input and output through the receiver RX4 and the transceiver TX4. In an example, the redistribution layer RDL5 of the upper chip CHIP2 is coupled to the redistribution layer RDL3 of the lower chip CHIP1 through a TSV.

Figure 9:
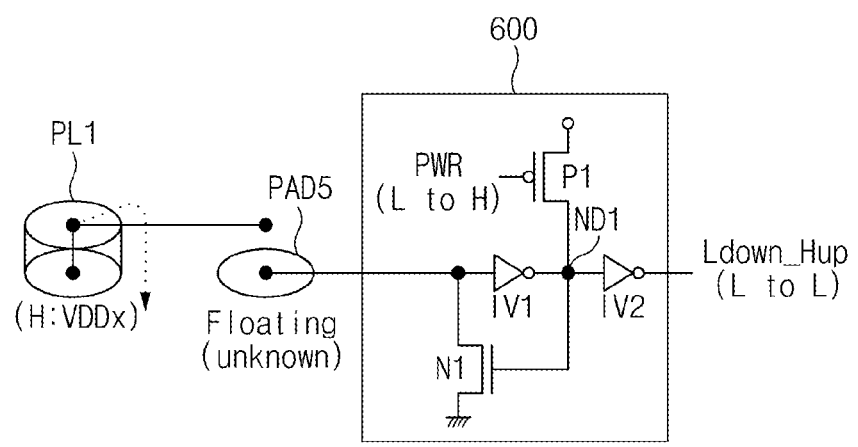
FIGS. 9 to 11 are circuit diagrams illustrating representations of examples of selection signal generation units illustrated in FIGS. 5 to 8.
Figure 10:
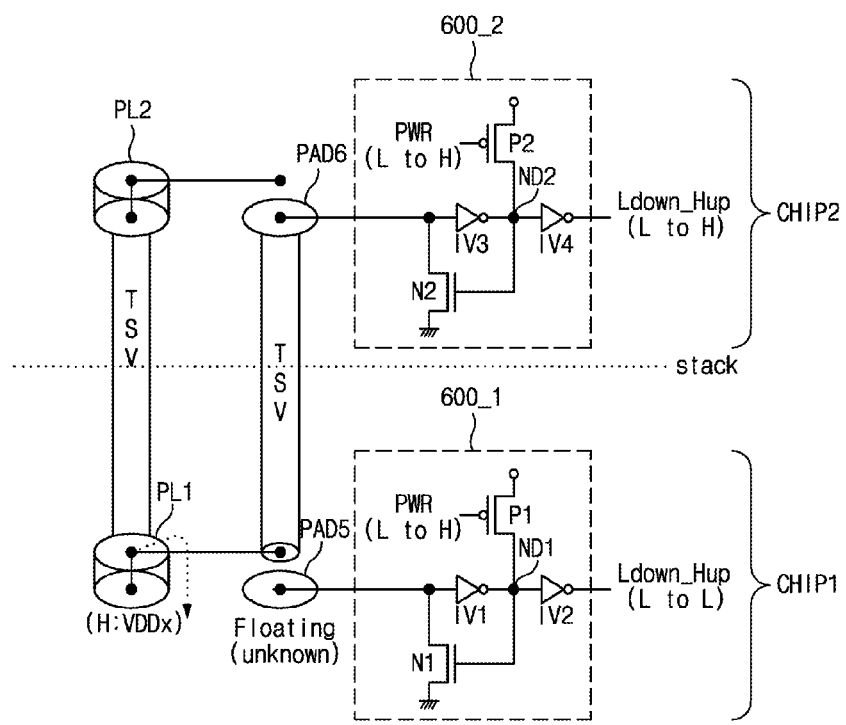
Figure 11:
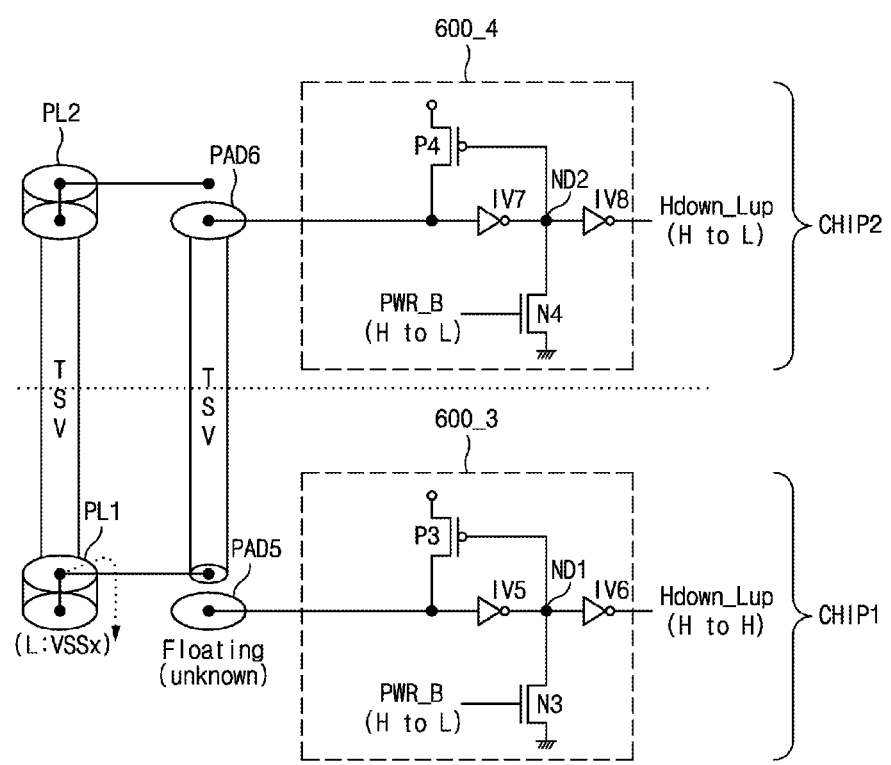

FIGS. 9 to 11 are circuit diagrams illustrating representations of examples of selection signal generation units (300, 300_1, 300_2, 500, 500_1, 500_2) illustrated in FIGS. 5 to 8.

An embodiment of FIG. 9 may be applied to a single-chip structure, for example, the selection signal generation unit 300 of FIG. 5 or the selection signal generation unit 500 of FIG. 7. An embodiment of FIG. 9 may be applied to the selection signal generation unit 300 of FIG. 5, and a description thereof will hereinafter be described below.

The selection signal generation unit 300 may include a power line PL1, a pad PAD5, and a selection signal driving unit 600. In an example, the power line PL1 may provide a voltage through which a signal has a high level (i.e., H) (e.g., a power-supply voltage (VDDx) level). The pad PAD5 may maintain a floating state (i.e., unknown).

The selection signal driving unit 600 may control a logic level of the selection signal (Ldowrn_Hup) in response to an output signal of the pad PAD5 and a power-ON signal PWR. The selection signal driving unit 600 may include a PMOS transistor P1 (i.e., serving as a pull-up driving element), an NMOS transistor N1 (i.e., serving as a pull-down driving element), and inverters (IV1, IV2).

For example, if the power-ON signal PWR is at a low level (i.e., L), the PMOS transistor P1 is turned on so that a node ND1 is precharged with a high level. In this example, if a node ND1 is at a high level, the NMOS transistor N1 is turned on so that an input signal of the inverter IV1 is at a low level. As a result, the selection signal (Ldowrn_Hup) becomes at a low level by inverters (IV1, IV2). That is, when a memory is initialized, an initial value is stored by an internal power-on signal PWR.

In this example, the selection unit 100 may select a lower redistribution layer RDL2 and the I/O unit 200. For example, if the power-ON signal PWR is at a high level (i.e. H), the PMOS transistor P1 is turned off.

An embodiment of FIG. 10 may be applied to a stack chip structure, for example, the selection signal generation units (300_1, 300_2) of FIG. 6 or the selection signal generation units (500_1, 500_2) of FIG. 8. An embodiment of FIG. 10 may be applied, for example, to the selection signal generation units (300_1, 300_2) of FIG. 6, and as such a description thereof will hereinafter be described below.

The selection signal generation units (300_1, 300_2) may be a stack chip structure formed by stacking a lower chip CHIP1 and an upper chip CHIP2. The selection signal generation units (300_1, 300_2) may include power lines (PL1, PL2), the pads (PAD5, PAD6), and the selection signal driving units (600_1, 600_2). In an example, the power line PL1 may provide a voltage through which a signal has a high level (i.e., H) (e.g., a power-supply voltage (VDDx) level). The pad PAD5 may maintain a floating state (i.e., unknown).

The selection signal driving unit (600_1) may control a logic level of the selection signal (Ldowrn_Hup) in response to an output signal of the pad PAD5 and a power-ON signal PWR. The selection signal driving unit (600_1) may include a PMOS transistor P1 serving as a pull-up driving element, an NMOS transistor N1 serving as a pull-down driving element, and inverters (IV1, IV2).

For example, if the power-ON signal PWR is at a low level (i.e., L), the PMOS transistor P1 is turned on so that a node ND1 is precharged with a high level. In an example, if a node ND1 is at a high level, the NMOS transistor N1 is turned on so that an input signal of the inverter IV1 is at a low level. As a result, the selection signal (Ldowrn_Hup) becomes at a low level by inverters (IV1, IV2). In an example, the selection unit (100_1) may select the lower redistribution layer RDL2 and the I/O unit (200_1).

For example, if the power-ON signal PWR is at a high level (i.e., H), the PMOS transistor P2 is turned off. In an example, the PAD PAD5 is in the floating state, so that the selection signal (Ldowrn_Hup) remains at a low level.

The power line PL2 is formed in the upper chip CHIP2, and is coupled to the power line PL1 located in the lower chip CHIP1 through a TSV. The power line PL2 is coupled to the power line PL1 so that the power line PL2 can provide a voltage having a high level (i.e., H) (e.g., a power-supply voltage (VDDx) level). The pad PAD6 is formed in the upper chip CHIP2, and is coupled to the power line PL1 located in the lower chip CHIP1 through a TSV.

The selection signal driving unit (600_2) may control a logic level of the selection signal (Ldowrn_Hup) in response to an output signal of the pad PAD6 and the power-ON signal PWR. The selection signal driving unit (600_2) may include a PMOS transistor P2 serving as a pull-up driving element, an NMOS transistor N2 serving as a pull-down driving element, and inverters (IV3, IV4).

For example, if the power-ON signal PWR is at a low level (i.e. L), the PMOS transistor P2 is turned on so that a node ND2 is precharged with a high level. In an example, if a node ND2 is at a high level, the NMOS transistor N2 is turned on so that an input signal of the inverter IV3 is at a low level. As a result, the selection signal (Ldowrn_Hup) becomes at a low level by inverters (IV3, IV4).

Thereafter, if the power-ON signal PWR transitions to a high level (i.e. H), the PMOS transistor P2 is turned off. A high-level signal received from the power line PL1 is applied to the selection signal driving unit (600_2) through a TSV and the pad PAD6.

As a result, an input signal of the inverter IV3 is at a high level so that the selection signal (Ldowrn_Hup) transitions to a high level. In an example, the node ND2 is at a low level so that the NMOS transistor N2 is turned off. For example, the selection unit (100_2) may select an upper redistribution layer RDL5 and the I/O unit (200_2).

An embodiment of FIG. 11 may illustrate an example in which a selection signal (Hdowrn_Lup) having a logic level opposite to that of the embodiment of FIG. 10 is output.

The selection signal generation units (300_1, 300_2) may be a stack chip structure by stacking a lower chip CHIP1 and an upper chip CHIP2. The selection signal generation units (300_1, 300_2) may include power lines (PL1, PL2), pads (PAD5, PAD6), and selection signal driving units (600_3, 600_4).

In an example, the power line PL1 may provide a voltage through which a signal has a low level (i.e., L) (e.g., a ground voltage (VSSx) level). The pad PAD5 may maintain a floating state.

The selection signal driving unit (600_3) may control a logic level of the selection signal (Hdowrn_Lup) in response to an output signal of the pad PAD5 and the power-ON signal (PWR_B). In an example, the power-ON signal (PWR_B) is an inversion signal of the power-ON signal PWR. The selection signal driving unit (600_3) may include a PMOS transistor P3 serving as a pull-up driving element, an NMOS transistor N3 serving as a pull-down driving element, and inverters (IV5, IV6).

For example, if the power-ON signal (PWR_B) is at a high level (i.e., H), the NMOS transistor N3 is turned on so that the node ND1 is precharged with a low level. In an example, if the node ND1 is at a low level, the PMOS transistor P3 is turned on so that an input signal of the inverter IV5 is at a high level. As a result, the selection signal (Hdowrn_Lup) is at a high level by inverters (IV5, IV6). In an example, the selection unit (100_1) may select the lower redistribution layer RDL2 and the I/O unit (200_1)(i.e., see FIG. 6).

If the power-ON signal PWR is at a low level (i.e., L), the NMOS transistor N3 is turned off. In an example, since the pad PAD5 is in the floating state, the selection signal (Hdowrn_Lup) remains at a high level.

The power line PL2 is formed in the upper chip CHIP2, and is coupled to the power line PL1 located in the lower chip CHIP1 through a TSV. Therefore, the power line PL2 is coupled to the power line PL1 so that the power line PL2 can provide a voltage having a low level (e.g., a power-supply voltage (VSSx) level). The pad PAD6 is formed in the upper chip CHIP2, and is coupled to the power line PL1 located in the lower chip CHIP1 through a TSV.

The selection signal driving unit (600_4) may control a logic level of the selection signal (Hdowrn_Lup) in response to an output signal of the pad PAD6 and the power-ON signal (PWR_B). The selection signal driving unit (600_4) may include a PMOS transistor P4 serving as a pull-up driving element, an NMOS transistor N4 serving as a pull-down driving element, and inverters (IV7, IV8).

For example, if the power-ON signal (PWR_B) is at a high level, the NMOS transistor N4 is turned on so that a node ND2 is precharged with a low level. In an example, if the node ND2 is at a low level, the PMOS transistor P4 is turned on so that an input signal of the inverter IV7 is at a high level. As a result, the selection signal (Hdowrn_Lup) becomes at a high level by inverters (IV7, IV8).

Thereafter, if the power-ON signal (PWR_B) transitions to a low level, the NMOS transistor P4 is turned off. A low-level signal received from the power line PL1 is applied to the selection signal driving unit (600_4) through a TSV and the pad PAD6.

As a result, an input signal of the inverter IV7 is at a low level so that the selection signal (Hdowrn_Lup) transitions to a low level. In an example, the node ND2 is at a high level so that the PMOS transistor P4 is turned off. Here, the selection unit (100_2) may select an upper redistribution layer RDL5 and the I/O unit (200_2).

As is apparent from the above description, the semiconductor device according to the various embodiments may have the following effects.

The semiconductor device according to the various embodiments may control a pad connection path through a control signal, and may prevent a pad line layer for a rearrangement layer from colliding with a TSV line layer, overlapping with a TSV line layer, or in some embodiments, intersecting with a TSV line layer.

The semiconductor device according to the embodiments may control a pad connection path through logic control, and may use the same mask in a 3DS memory having a RDL.

Figure 12:
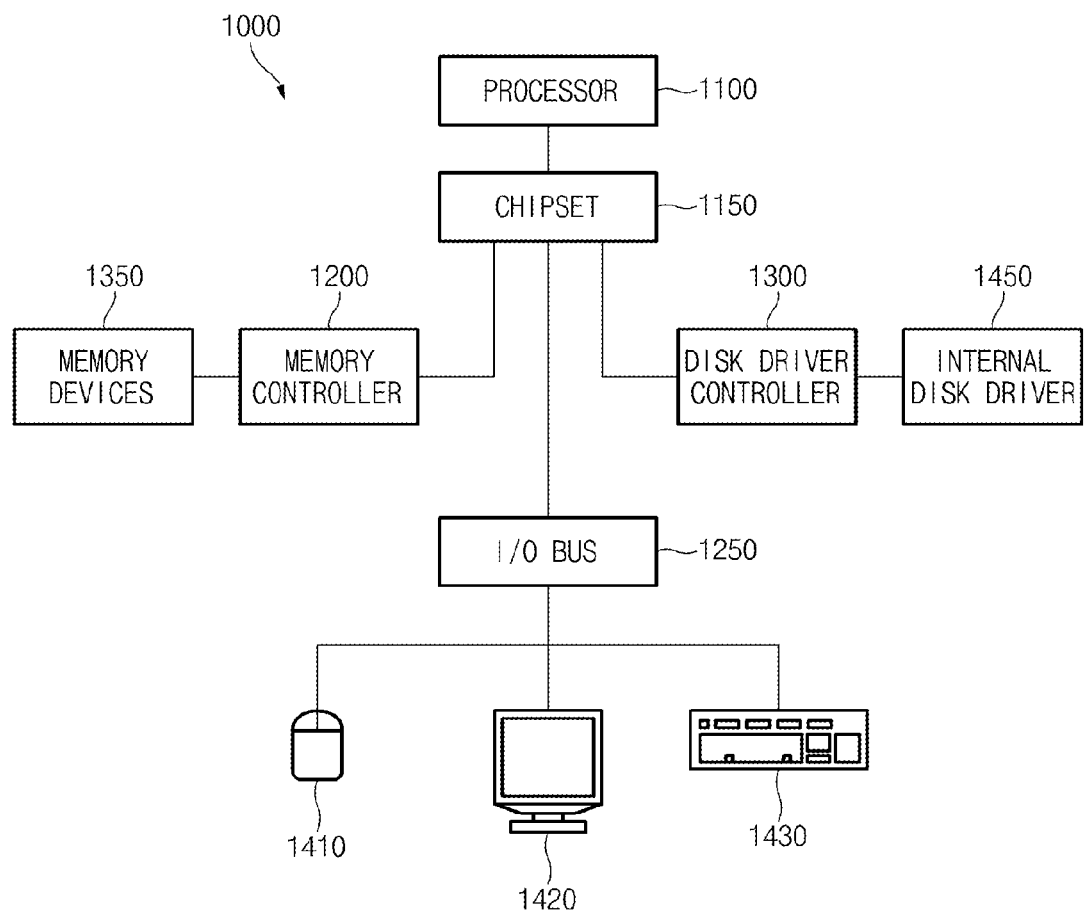
FIG. 12 illustrates a block diagram of an example of a representation of a system employing semiconductor device in accordance with the various embodiments discussed above with relation to FIGS. 1-11.

The semiconductor devices discussed above (see FIGS. 1-11) are particular useful in the design of memory devices, processors, and computer systems. For example, referring to FIG. 12, a block diagram of a system employing a semiconductor device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-11. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1300 may also be operably coupled to the chipset 1150. The disk drive controller 1300 may serve as the communication pathway between the chipset 1150 and one or more internal disk driver 1450. The internal disk driver 1450 may facilitate disconnection of the external data storage devices by storing both instructions and data. The disk drive controller 1300 and the internal disk driver 1450 may communicate with each other or with the chipset 1150 using virtually any type of communication protocol, including all of those mentioned above with regard to the I/O bus 1250.

It is important to note that the system 1000 described above in relation to FIG. 12 is merely one example of a system employing a semiconductor device as discussed above with relation to FIGS. 1-11. In alternate embodiments, such as cellular phones or digital cameras, the components may differ from the embodiments illustrated in FIG. 12.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. All changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a first redistribution layer configured to allow for input and output of a first signal through the first redistribution layer;
   a second redistribution layer configured to allow for input and output of a second signal through the second redistribution layer;
   a first input/output (I/O) unit configured to input and output the first signal or the second signal through the first I/O unit;
   a first selection unit configured to selectively couple a connection among the first redistribution layer, the second redistribution layer, and the first I/O unit in response to a logic level of a first selection signal; and
   a first selection signal generation unit configured to generate the first selection signal,
   wherein the first selection signal generation unit includes a first selection signal driving unit configured to drive the first selection signal in response to a signal of a first pad and a power-ON signal,
   wherein the first selection signal driving unit includes:
   a first pull-up driving element coupled between a power-supply voltage terminal and a first node, and configured for being controlled by the power-ON signal;
   a first pull-down driving element coupled between an output terminal of the first pad and a ground voltage terminal, and including a gate terminal coupled to the first node;
   a first inverter coupled between an output terminal of the first pad and the first node; and
   a second inverter configured to output the first selection signal by inverting an output signal of the first node.

2. The semiconductor device according to claim 1, wherein the first selection unit selects the first redistribution layer when the first selection signal is at a first logic level, and selects the second redistribution layer when a second selection signal is at a second logic level different from the first logic level.

3. The semiconductor device according to claim 1, wherein the first I/O unit includes:
   a first receiver configured to output a signal received from the first selection unit; and
   a first transceiver configured to output an external input signal to the first selection unit.

4. The semiconductor device according to claim 1, wherein the first I/O unit includes:
   a second transceiver and a second receiver configured to input/output the first signal of the first redistribution layer received from the first selection unit; and
   a third transceiver and a third receiver configured to input/output the second signal of the second redistribution layer received from the first selection unit.

5. The semiconductor device according to claim 1, wherein the first selection signal generation unit further comprising:
   a first power line configured to provide a power-supply voltage; and
   the first pad configured to provide a floating state.

6. The semiconductor device according to claim 1, wherein the first selection signal driving unit outputs the first selection signal of a low level when the power-ON signal is at a low level, and maintains the first selection signal of a low level when the power-ON signal transitions to a high level.

7. The semiconductor device according to claim 1, further comprising:
   a third redistribution layer configured to allow for input and output of a third signal through the third redistribution layer;
   a fourth redistribution layer configured to allow for input and output of a fourth signal through the fourth redistribution layer, and coupled to the second redistribution layer through a through silicon via (TSV);

a second input/output (I/O) unit configured to input and output the third signal or the fourth signal through the second I/O unit;

a second selection unit configured to selectively couple the third redistribution layer, the fourth redistribution layer, and input/output (I/O) nodes of the second I/O unit in response to a logic level of a second selection signal; and a second selection signal generation unit configured to generate the second selection signal.

8. The semiconductor device according to claim 7, wherein the second selection unit selects a third redistribution layer when the second selection signal is at a first level, and selects a fourth redistribution layer when the second selection signal is at a second level different from the first logic level.

9. The semiconductor device according to claim 7, wherein the second I/O unit includes:
a fourth receiver configured to output a signal received from the second selection unit; and
a fourth transceiver configured to output an external input signal to the second selection unit.

10. The semiconductor device according to claim 7, wherein the second I/O unit includes:
a fifth transceiver and a fifth receiver configured to input/output the third signal of the third redistribution layer received from the second selection unit; and
a sixth transceiver and a sixth receiver configured to input/output the fourth signal of the fourth redistribution layer received from the second selection unit.

11. The semiconductor device according to claim 7, wherein the second selection signal generation unit includes:
a third power line coupled to a first power line of the first selection signal generation unit through the through silicon via (TSV);
a third pad coupled to the first power line through the TSV; and
a third selection signal driving unit configured to drive the second selection signal in response to a signal of the third pad and a power-ON signal.

12. The semiconductor device according to claim 11, wherein the third selection signal driving unit includes:
a third pull-up driving element coupled between a power-supply voltage terminal and a third node, and configured for being controlled by the power-ON signal;
a third pull-down driving element coupled between an output terminal of the third pad and a ground voltage terminal, and including a gate terminal coupled to the third node;
a fifth inverter coupled between an output terminal of the third pad and the third node; and
a sixth inverter configured to output the second selection signal by inverting an output signal of the third node.

13. The semiconductor device according to claim 11, wherein the third selection signal driving unit outputs the second selection signal of a low level when the power-ON signal is at a low level, and transitions the second selection signal to a high level in response to a signal received from the third pad when the power-ON signal transitions to a high level.

14. The semiconductor device according to claim 11, wherein the third selection signal driving unit includes:
a fourth pull-up driving element coupled between a power-supply voltage terminal and an output terminal of the third pad, and configured for being controlled by an output signal of a fourth node;

a fourth pull-down driving element coupled between the fourth node and a ground voltage terminal, and configured to receive an inversion signal of the power-ON signal through a gate terminal;
a seventh inverter coupled between an output terminal of the third pad and the fourth node; and
an eighth inverter configured to output the second selection signal by inverting an output signal of the fourth node.

15. The semiconductor device according to claim 11, wherein the third selection signal driving unit outputs the second selection signal of a high level when an inversion signal of the power-ON signal is at a high level, and transitions the second selection signal to a low level in response to a signal received from the third pad when the inversion signal of the power-ON signal transitions to a low level.

16. The semiconductor device according to claim 7, wherein the through silicon via (TSV) is configured to couple the second redistribution layer formed in a lower chip to the fourth redistribution layer formed in an upper chip.

17. A semiconductor device comprising:
a first redistribution layer configured to allow for input and output of a first signal through the first redistribution layer;
a second redistribution layer configured to allow for input and output of a second signal through the second redistribution layer;
a first input/output (I/O) unit configured to input and output the first signal or the second signal through the first I/O unit;
a first selection unit configured to selectively couple a connection among the first redistribution layer, the second redistribution layer, and the first I/O unit in response to a logic level of a first selection signal; and
a first selection signal generation unit configured to generate the first selection signal,
wherein the first selection signal generation unit includes a second selection signal driving unit configured to drive the first selection signal in response to a signal of a second pad and a power-ON signal,
wherein the second selection signal driving unit includes:
a second pull-up driving element coupled between a power-supply voltage terminal and an output terminal of the second pad, and configured for being controlled by an output signal of a second node;
a second pull-down driving element coupled between an output terminal of the second node and a ground voltage terminal, and configured to receive an inversion signal of the power-ON signal through a gate terminal;
a third inverter coupled between an output terminal of the second pad and the second node; and
a fourth inverter configured to output the first selection signal by inverting an output signal of the second node.

18. The semiconductor device according to claim 17, wherein the second selection signal driving unit outputs the first selection signal of a high level when the inversion signal of the power-ON signal is at a high level, and maintains the first selection signal at a high level when the inversion signal of the power-ON signal transitions to a low level.

19. The semiconductor device according to claim 17, wherein the first selection signal generation unit further comprising:
a second power line configured to provide a ground voltage; and
the second pad configured to provide a floating state.

* * * * *